United States Patent
Singh et al.

(10) Patent No.: US 7,051,008 B2
(45) Date of Patent: *May 23, 2006

(54) METHOD AND SYSTEM FOR DETERMINING STATE-OF-HEALTH OF A NICKEL-METAL HYDRIDE BATTERY USING AN INTELLIGENT SYSTEM

(75) Inventors: Pritpal Singh, Media, PA (US); Craig Fennie, Jr., New Brunswick, NJ (US); David E. Reisner, Bristol, CT (US)

(73) Assignee: U.S. Nanocorp, Farmington, CT (US)

( * ) Notice: Subject to any disclaimer, the term of this patent is extended or adjusted under 35 U.S.C. 154(b) by 817 days.

This patent is subject to a terminal disclaimer.

(21) Appl. No.: 10/127,292

(22) Filed: Apr. 22, 2002

(65) Prior Publication Data

US 2003/0074335 A1    Apr. 17, 2003

Related U.S. Application Data

(63) Continuation-in-part of application No. 09/041,501, filed on Mar. 12, 1998, now Pat. No. 6,456,988.

(60) Provisional application No. 60/051,165, filed on Jun. 27, 1997, provisional application No. 60/040,476, filed on Mar. 12, 1997.

(51) Int. Cl.
   *G06F 15/18*    (2006.01)
(52) U.S. Cl. ............................................. 706/2
(58) Field of Classification Search ............... 706/2
   See application file for complete search history.

(56) References Cited

U.S. PATENT DOCUMENTS

| | | | |
|---|---|---|---|
| 3,720,869 A | 3/1973 | Rowlette | 324/29.5 |
| 3,895,284 A | 7/1975 | Schweizer et al. | 320/48 |
| 3,984,762 A | 10/1976 | Dowgiallo, Jr. | 324/29.5 |
| 4,307,330 A | 12/1981 | Belot | 320/44 |
| 4,433,295 A | 2/1984 | Zaugg | 324/429 |
| 4,595,880 A | 6/1986 | Patil | 324/427 |
| 4,638,237 A | 1/1987 | Fernandez | 320/44 |
| 4,677,363 A | 6/1987 | Kopmann | 320/44 |
| 4,743,855 A | 5/1988 | Randin et al. | 324/430 |
| 4,775,827 A | 10/1988 | Ijntema et al. | 320/44 |
| 4,876,513 A | 10/1989 | Brilmyer et al. | 324/427 |
| 4,947,123 A | 8/1990 | Minezawa | 324/427 |
| 4,958,127 A | 9/1990 | Williams et al. | 324/426 |
| 5,159,272 A | 10/1992 | Rao et al. | 324/429 |

(Continued)

FOREIGN PATENT DOCUMENTS

JP    6-242192    9/1994

OTHER PUBLICATIONS

Ultah, et al., "Fast Intelligent Battery Charging: Neural Fuzzy Approach", IEEE AES Systems Magazine; Jun. 1996.

(Continued)

*Primary Examiner*—George Davis
(74) *Attorney, Agent, or Firm*—Cantor Colburn LLP

(57) ABSTRACT

A method and system for determining the state-of-health of a nickel-metal hydride battery connected to a load comprises: detecting at least one of a real and imaginary part of an impedance of the battery at each of a first set of selected frequencies, the first set of selected frequencies including at least one frequency, and determining the state-of-health of the battery from a fuzzy system trained in a relationship between each impedance and the state-of-health, wherein the state-of-health is a function of the battery's ability to deliver power required by the load and the battery's capacity to meet load requirements.

20 Claims, 6 Drawing Sheets

U.S. PATENT DOCUMENTS

| | | | |
|---|---|---|---|
| 5,241,275 A | 8/1993 | Fang | 324/430 |
| 5,284,719 A | 2/1994 | Landau et al. | 429/50 |
| 5,321,627 A | 6/1994 | Reher | 364/483 |
| 5,349,540 A | 9/1994 | Birkle et al. | 364/578 |
| 5,369,364 A | 11/1994 | Renirie et al. | 324/430 |
| 5,372,898 A | 12/1994 | Atwater et al. | 429/90 |
| 5,381,096 A | 1/1995 | Hirzel | 324/427 |
| 5,404,106 A | 4/1995 | Matsuda | 324/431 |
| 5,451,881 A | 9/1995 | Finger | 324/433 |
| 5,457,377 A | 10/1995 | Jonsson | 320/5 |
| 5,541,489 A | 7/1996 | Dunstan | 320/2 |
| 5,587,660 A | 12/1996 | Chabbert et al. | 324/426 |
| 5,614,829 A | 3/1997 | Song | 324/427 |
| 5,631,540 A | 5/1997 | Nguyen | 320/30 |
| 5,654,903 A | 8/1997 | Reitman et al. | 364/551.01 |
| 5,656,919 A | 8/1997 | Proctor et al. | 320/30 |
| 5,659,240 A | 8/1997 | King | 320/30 |
| 5,670,861 A | 9/1997 | Nor | 320/15 |
| 5,701,078 A | 12/1997 | Lee et al. | 324/430 |
| 5,703,464 A | 12/1997 | Karunasiri et al. | 320/19 |
| 5,705,929 A | 1/1998 | Caravello et al. | 324/430 |
| 5,825,156 A | 10/1998 | Patillon et al. | 320/21 |
| 5,936,385 A | 8/1999 | Patillon et al. | 320/136 |
| 6,011,379 A | 1/2000 | Singh et al. | 320/132 |
| 6,668,247 B1 * | 12/2003 | Singh et al. | 706/2 |

OTHER PUBLICATIONS

Cerruto, et al., "Energy Flows Management In Hybrid Vehicles By Fuzzy Logic Controller", IEEE proceedings of the 7th Mediterranean Electrotechnical Conference; Apr. 1994.

Poulin, et al., "An Expert Management System for URLA Batteries In Remote Telecommunication Centers", IEEE INTELEC, the 16th Inter. Telecommunications Energy Conference; Nov. 1994.

Brady et al., "A Symbolic Programming Approach To Intelligent Data Reduction"; IEEE Proceedings of the 24th Intersociety Energy Conversion Engineering Conference; Aug. 1989.

S. Sathyanarayana, S. Venugopalan, M.L. Gopikanth, "Impedance parameters and the state-of-charge. I. Nickel-cadmium battery", Journal of Applied Electrochemistry (1979), pp. 125-139.

S.A.G R. Karunathilaka, N. A. Hampson, T.P. Haas, W. G. Marshall, R. Leek and T.J. Sinclair, "The Impedance of the alkaline zinc-mercuric oxide cell. I. Cell Behavior and interpretation of impedance spectra", Journal of Applied Electrochemistry (1981); pp. 573-582.

Naoki et al., "Estimation of the state of charge of Sealed Lead Battery by Neural Networks", Institute of Electronics, Information and Communication Engineers, 1996.

Naoki, et al., "Prediction of the Capacity of Sealed Lead Battery by Neural Networks", Institute Of Electronics, Information and Communication Engineers, 1996.

Final Report for Nickel Cadmium Battery Expert System, Martin Marietta Corporation Airospace Division, 1986.

Jean A zieu, Hassan Smimite, Christian Glaize, "Improvement of intelligent battery controller: state-of-charge indicator and associated functions", Journal of Power Sources, 1997, pp. 157-161.

S.A.G.R. Karunathilaka, R. Leek, N. A. Hampson, M. Hughes and T. J. Sinclair, "A state-of-charge test for the Li-CuO cell", Journal of Applied Electrochemistry (1983), pp. 351-354.

S.A.G.R. Karunathilaka, R. Leek, N. A. Hampson, M. Hughes and T.J. Sinclair, "A state-of-charge test for the Li-CuO cell", Journal of Appied Electrochemistry (1983), pp. 351-354.

S.A.G.R. Karunathilaka, N.A. Hampson, M. Hughes, W.G. Marshall, R. Leek and T.J. Sinclair, "The prediction of the state-of-charge of some commercial primary cells", Journal of Applied Electrochemistry (1983), pp. 577-586.

Shigenori, et al., "Estimation of Residual Capacity of a Lead Battery using Neural Networks", Denki Gakkai Sangvo Keisoku seigyo Kenkyukai shiryo, 1993.

Tanpo N., "Development of a Battery Checking System using Neural Network", proceedings of the Joint Conference of Hokuriku Chapters of Institute of Elect. Eng., 1995.

Alex Bykat, "Design of an Expert System for Diagnosis of a Space Borne Battery Based Electric Power System", IEEE, IECEC, proceedings of the 25th Intersociety Energy Conversion Engineering Conference, Aug. 1990.

Taylor, et al., "Standard Smart Batteries for Consumer Applications", IEEE proceedings of the 10th Annual Battery Conference on Applications and Advances, Jan. 1995.

Tanpo. et al.., "Estimation of the state-of -charge of Sealed Lead Battery by Neural Neworks", The Institute of Electronics, Information and Communication Engineers, 1996.

Marcus Stoll, "Neural Networks—A Proper Approach to the Energy Management Problem?", Proceedings of the 10th E. C. Phatorotaic Solar Energy International Conference.

Tanpo et al., "Prediction of the Capacity of Sealed Lead Battery by Neural Network", Conference proceedings of the Institute of Electronics, Information and Communication Engineers, 1996.

Tanpo et al., "Development of a Battery Checking System Using Neural Network", proceedings of the Joint Conference of Hokuraku Chapters of Institutes of Electrical engineers, 1995.

* cited by examiner

METHOD AND SYSTEM FOR DETERMINING STATE-OF-HEALTH OF A NICKEL-METAL HYDRIDE BATTERY USING AN INTELLIGENT SYSTEM

CROSS REFERENCE TO RELATED APPLICATIONS

This application is a Continuation-In-Part of U.S. patent application Ser. No. 09/041,501, filed Mar. 12, 1998 now U.S. Pat. No. 6,456,988, which is wholly incorporated herein by reference, and which claims the benefit of U.S. provisional patent application Ser. No. 60/040,476 filed Mar. 12, 1997 and U.S. provisional patent application Ser. No. 60/051,165 filed Jun. 27, 1997.

This invention was made with Government support under contract USZA22-97-P-0010 awarded by the U.S. Department of Defense. The Government has certain rights in the invention.

BACKGROUND

The present invention relates to determining the state-of-health (SOH) of an electrochemical device. More particularly, the present invention relates to determining the SOH of a nickel metal hydride batteries using an intelligent system, e.g. a fuzzy logic system.

The SOH of a battery, fuel cell, or other electrochemical device has been interpreted in different ways by scientists/engineers in the field. In the case of valve regulated lead acid (VRLA) batteries used by utility companies for providing emergency backup power, SOH is interpreted to mean that a battery is close to the end of its cycle life and needs replacement. Several papers including Feder and Hlavac 1994 INTELEC Conf. Proc. pp. 282–291 (1994) and Hawkins and Hand 1996 INTELEC Conf. Proc. pp. 640–645 (1996) demonstrate that the increase in impedance of aging VRLA batteries can be used to indicate the SOH of the battery.

Another interpretation of battery SOH is the capability of a battery to meet its load demand. This is also referred to as "battery condition" by others in the field. To obtain the SOH of a battery in the terms defined, both the available charge capacity of the battery and the maximum power available from the battery are required. Several approaches have been used to determine the condition of a battery. In U.S. Pat. No. 5,365,453 is described a method in which a ratio of a change in battery voltage to a change in load is used to predict impending battery failure in battery powered electronic devices. Similar methods in which the battery response to and recovery from the application of a load is used to determine the SOH of batteries are reported in U.S. Pat. Nos. 4,080,560 and 5,159,272. While these load profiling approaches work reasonably well for batteries integrated into a system, they are not necessarily accurate or reliable ways of determining the SOH of batteries outside a system.

SUMMARY

The above-discussed and other drawbacks and deficiencies of the prior art are overcome or alleviated by a method of and system for determining the state-of-health of a nickel-metal hydride battery connected to a load, the method comprising: detecting at least one of a real and imaginary part of an impedance of the battery at each of a first set of selected frequencies, said first set of selected frequencies including at least one frequency and determining the state-of-health of the battery from a fuzzy system trained in a relationship between each said impedance and said state-of-health.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION

Figure 1:
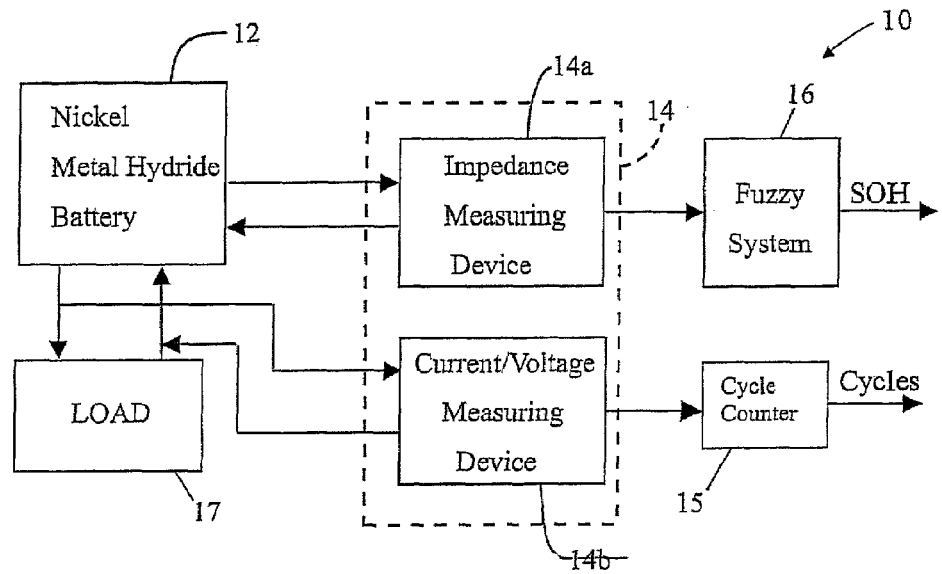
FIG. 1 is a block diagram of method for determining state-of-health of a Nickel metal hydride battery in accordance with the present invention.

Referring to FIG. 1 a system for determining State-of-Health (SOH) in accordance with present invention is generally shown at 10. System 10 comprises nickel metal hydride battery 12, a load 17, an interface circuit 14 comprising impedance measuring device 14$a$ and current-voltage measuring device 14$b$, a cycle counter 15, and a fuzzy system 16. The nickel metal hydride battery comprises a series string of nickel metal hydride cells. Fuzzy system 16 is trained in the relationship between impedance (via impedance measuring device 14$a$) and the SOH of the nickel metal hydride battery 12.

The current draw of the load from the nickel metal hydride battery 12 and voltage across the battery are measured using the current/voltage measuring device 14$b$. A cycle is defined by the complete discharge of the battery followed by a complete recharge of the battery. The cycle number represents the number of battery cycles that the battery has completed. The cycle number of the nickel metal hydride battery under specific load conditions achieved by loading the battery with a load 17 can be used along with the SOH to determine whether a battery is malfunctioning, i.e., whether the determined SOH is appropriate for the battery's age as indicated by the cycle number. The cycle number may also be used as a measure of a battery's longevity when used under specified conditions, e.g., with a specific load. Thus, the impedance measurements are provided to fuzzy system 16 as inputs, with the SOH being the output of fuzzy system 16. If the SOH is poor, then the SOH and cycle number may then be useful to determine whether the battery is malfunctioning or whether it has merely reached the end of its life.

A fuzzy system may alternatively be trained in directly determining whether a battery is malfunctioning or not based on inputs including the cycle number.

The SOH of a nickel metal hydride battery is defined as the device's ability to perform a specified task. Although a nickel metal hydride battery may be at a high State-of-Charge (SOC), its health may be poor due to loss of electrolyte or otherwise. Although a fully discharged nickel metal hydride battery may be at a low SOC, due to depletion of the charged species of the electrodes or otherwise, it may well be in a full SOH, which would be realized subsequent to recharging the nickel metal hydride battery. Phenomena such as loss of electrolyte and depletion of charged species affect the nickel metal hydride battery's power delivery capability and its capacity. Therefore, the nickel metal hydride battery's State-of-Health is a function of its ability to deliver power required by a load and its capacity to meet those requirements.

Figure 2:
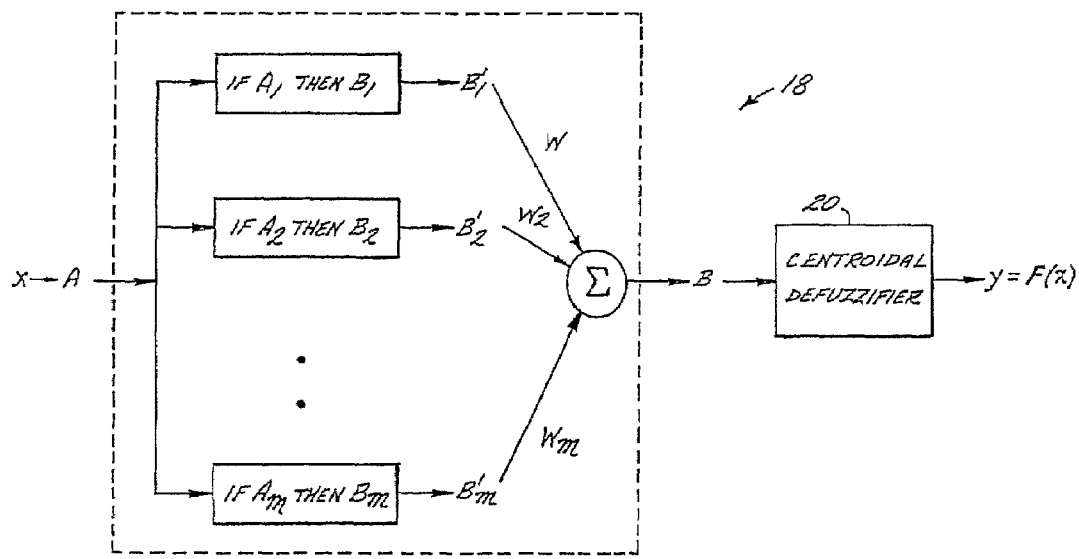
FIG. 2 is a block diagram of an additive fuzzy system for use in the present invention.

Referring to FIG. 2, a preferred embodiment of the fuzzy system comprises an additive fuzzy system 18 with centroid defuzzification 20. Additive fuzzy system 18 stores m fuzzy rules of the form, "if X is $A_j$ then Y is $B_j$", and computes the output F(x) as the centroid of the summed and partially fired then-part fuzzy sets $B'_j$, see Fuzzy Engineering by Bart Kosko, Prentice Hall, 1997. Equation 1 expresses mathematically additive fuzzy system 18 as:

$$F(x) = \frac{\sum_{j=1}^{m} w_j a_j(x) V_j c_j}{\sum_{j=1}^{m} w_j a_j(x) V_j} \quad \text{EQUATION 1}$$

$$a_j(x) = \prod_{i=1}^{n} a_j^i(x_i) \quad \text{EQUATION 2}$$

$$B = \sum_{j=1}^{m} w_j B'_j = \sum_{j=1}^{m} w_j a_j(x) B_j \quad \text{EQUATION 3}$$

where:
$w_j$ is a weight of rule j,
$a_j^i$ represents if-part set function (membership function of input i of rule j on input i),
$a_j$ represents joint if-part set function (result of "$a_j^1$ 'and' $a_j^2$ . . . 'and' $a_j^i$") that states the degree to which the input x belongs to the if-part fuzzy set $a_j$,
$B_j$ represents then-part set function (membership function j on the output),
$V_j$ is the finite positive volume (or area) of the then-part set $B_j$,
$c_j$ is the centroid of the then-part set $B_j$,
$B'_j$ is the scaled then-part set (scaled output membership function j, result of $a_j(x)B_j$), and
B is the output set prior to defuzzification.

In linguistic terms, additive fuzzy system 18 can be described in terms of a set of if-then rules:
RULE 1: If $X_1$ is $a^1_1$ and $X_2$ is $a^2_1$ . . . and $X_n$ is $a^n_1$, then F(X) is $B_1$,
RULE 2: If $X_1$ is $a^1_2$ and $X_2$ is $a^2_2$ . . . and $X_n$ is $a^n_2$, then F(X) is $B_2$,
RULE m: If $X_1$ is $a^1_m$ and $X_2$ is $a^2_m$ . . . and $X_n$ is $a^n_m$, then F(X) is $B_m$, where m is the number of rules and n is the number of inputs.

The linguistic description and the mathematical description of additive fuzzy system 18 are equivalent. They are merely different views of the same fuzzy system. Both approaches map a given input X to a given output F(X) by a process known as fuzzy inference. The following example demonstrates the fuzzy inference process. First, fuzzify the inputs by taking the inputs and determine the degree to which they belong to each of the appropriate input fuzzy sets via membership functions. Mathematically expressed as: "$a_1^1(X_1), a_1^2(X_2) \ldots a_1^m(X_m)$". Linguistically expressed as: "If $X_1=a_1^1$, If $X_2=a_1^2$, . . . , If $X_m=a_1^{m}$". Second, apply a fuzzy operator by combining if-part sets of a given rule to obtain one number that represents the result of the antecedent for that rule. Mathematically expressed as EQUATION 2 hereinabove. Linguistically expresses as: "$a_1^1$ 'and' $a_1^2$ 'and' $a_1^{m}$" where 'and' is the T-norm product. Third, apply an implication method by shaping the consequent (or output fuzzy set) based on the result of the antecedent for that rule. Mathematically expressed as: "$B_1=a_1(X)B_1$". Linguistically expressed as: "If $a_1(X)$, then $B_1$". Fourth, aggregate all outputs by combining the consequent of each rule to form one output fuzzy set. Mathematically expressed as EQUATION 3 hereinabove. Fifth, defuzzify by mapping the output fuzzy set to a crisp number. Mathematically expressed as "F(x)=centroid(B)=EQUATION 1". In general see Fuzzy Logic Toolbox, for use with MATLAB, The Mathworks, Inc. by Jang and Gulley.

By way of example, a supervised gradient descent can learn or tune additive fuzzy system 18 given by EQUATION 1 by changing the rule weights $w_j$, the then-part volumes $V_j$, the then-part centroids $c_j$, or the if-part set functions $a_j$.

Figure 3A:
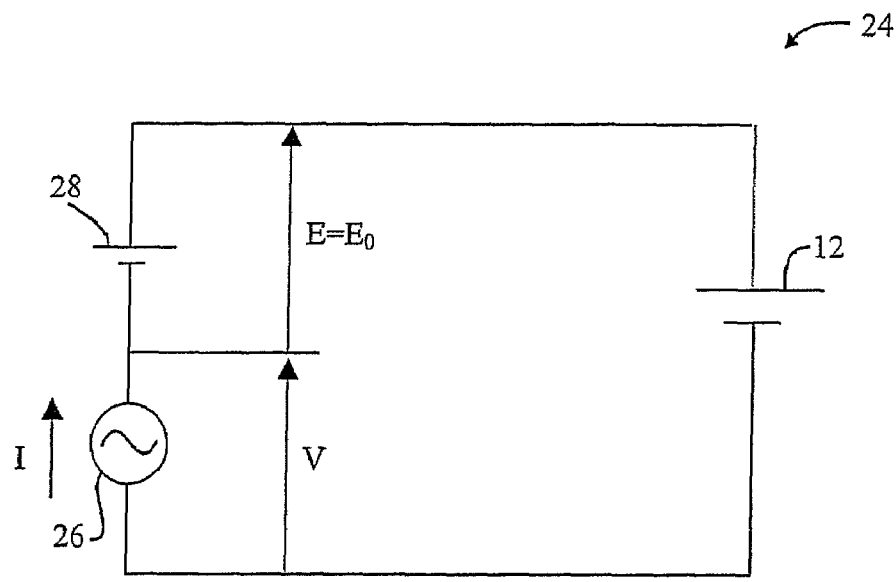
FIG. 3A is a schematic diagram of a circuit to measure battery impedance.

Referring to FIG. 3A, a circuit 24 for measuring nickel metal hydride battery impedance is shown. Circuit 24 comprises nickel metal hydride battery 12 whose impedance is to be measured, an a.c. current generator 26 of variable frequency, and a d.c. variable voltage generator 28. Nickel metal hydride battery 12 and generators 26 and 28 are connected in series in any order but in such a way that nickel metal hydride battery 12 and d.c. generator 28 have in common poles of the same sign, in this example positive poles. The no-load voltage of nickel metal hydride 12 is designated as $E_0$, the effective current of a.c. generator 26 is designated as I and the voltage of d.c. generator 28 is designated as E. Voltage E is chosen so as to be equal to $E_0$ to prevent nickel metal hydride battery 12 issuing a direct current. In this way, the current flowing in the loop made up of nickel metal hydride battery 12 and generators 26 and 28 has no direct component and its alternating component designated I determines the voltage drop V across the nickel metal hydride battery 12. Variables V and I are complex numbers and their ratio V/I=Z=Z'+jZ" defines the internal complex impedance of nickel metal hydride battery 12. This impedance has a real or resistive part Z' and an imaginary or reactive part Z". The magnitude of this impedance, |Z|, is given by $|Z|=(Z'^2+Z''^2)^{1/2}$. The phase angle of the impedance, θ, is given by $\theta=\tan^{-1}(Z''/Z')$. The battery impedance is a function of the frequency f of the a.c. current.

Figure 3B:
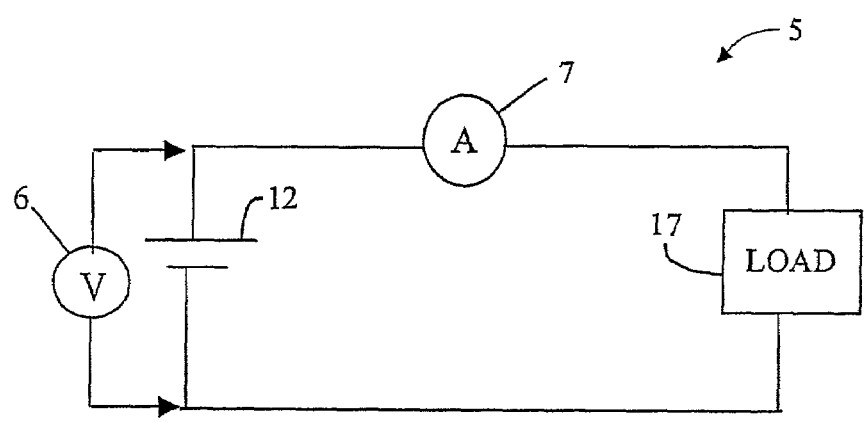
FIG. 3B is a schematic diagram of a circuit to measure the current and voltage delivered by the nickel metal hydride battery to the load.

Referring to FIG. 3B, a circuit 5 for measuring the current draw of a load 17 connected to the nickel metal hydride battery 12 and the voltage across the nickel metal hydride battery 12 is shown. A voltmeter 6 is placed across the terminals of a nickel metal hydride battery 12 such that the positive lead of the voltmeter is connected to the positive terminal of said nickel metal hydride battery and the negative lead of the voltmeter is connected to the negative terminal of said nickel metal hydride battery. An ammeter 7 is used to measure the current from said nickel metal hydride battery to the load 17. The ammeter 7 is connected in series between said nickel metal hydride battery 12 and the load 17 such that the current must flow from nickel metal hydride battery 12 through the ammeter 7 to pass into the load.

Figure 4:
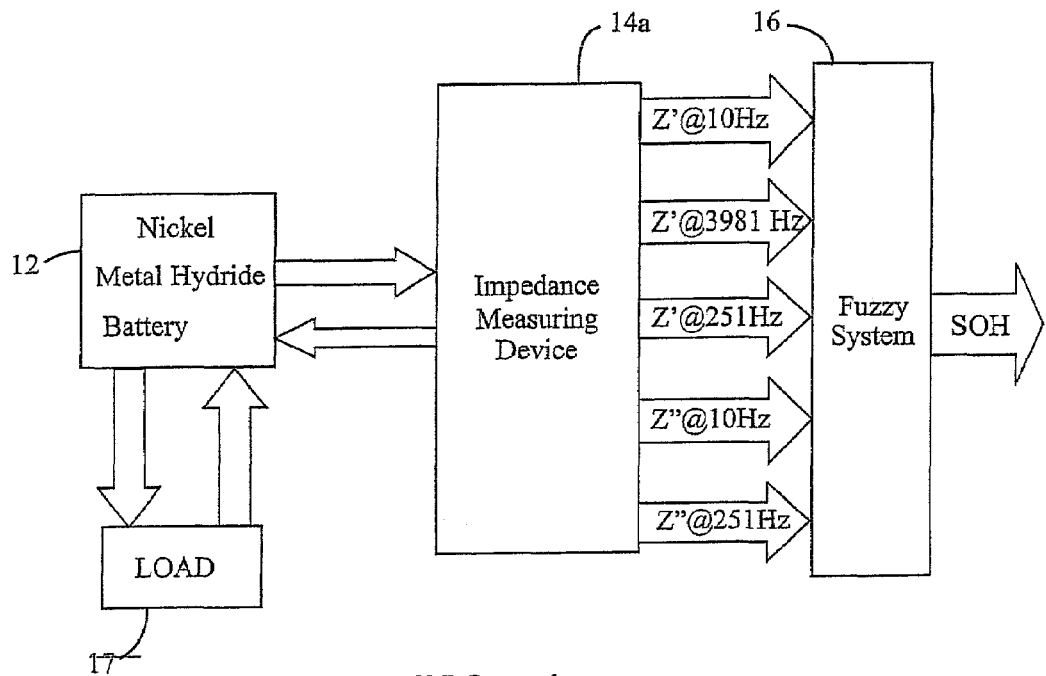
FIG. 4 is a block diagram of a fuzzy system for use in determining the state of health in the present invention.

Referring now to FIG. 4, fuzzy system 16 is trained in the relationship between certain impedance characteristics (e.g., real part, imaginary part, magnitude, and/or phase angle) at selected frequencies and the SOH of the nickel metal hydride battery. Specifically, the fuzzy system learns the underlying function F that relates the real and imaginary parts of the impedance at a first frequency f1, the real and imaginary parts of the impedance at a second frequency f2, and the real part of the impedance at a third frequency f3 to the state-of-health. The frequency f1 may be between about 10 Hz and about 30 Hz, is preferably between about 10 Hz and about 20 Hz, and in the example shown is 10 Hz. The frequency f2 may be between about 100 Hz and about 500 Hz, is preferably between about 200 Hz and about 500 Hz, and in the example shown is 251 Hz. The frequency f3 may be between 400 Hz and 10 kHz, is preferably between about 2 kHz and 10 kHz, and in the example shown is 3,981 Hz.

While specific selected frequencies are listed herein and are known to be effective, it is understood that real and/or imaginary parts of impedance at other various frequencies and/or fewer different frequencies may also be effective in obtaining a valid result. Furthermore, the optimal frequencies for measuring impedance may vary from one type of nickel metal hydride battery to another, and can be determined empirically by mapping the impedances of a nickel metal hydride battery in various known conditions over a range of frequencies and selecting the frequency or frequencies at which the real and/or imaginary parts of the impedance varies the most.

Figure 5:
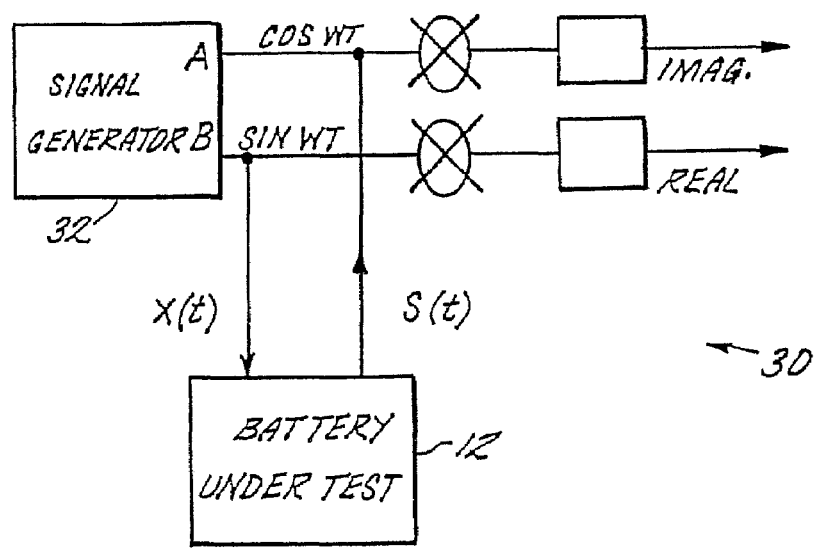
FIG. 5 is a circuit block diagram for determining nickel metal hydride battery impedance in accordance with the present invention.

Referring to FIG. 5, a circuit 30 for measuring impedance of nickel metal hydride battery 12 at three frequencies is generally shown. Circuit 30 comprises nickel metal hydride battery 12 whose impedance is to be measured and an a.c. signal generator 32. A small amplitude, perturbing sinusoidal signal, $x(t)=X_0 \sin(\omega t)$, is applied to nickel metal hydride battery 12. The response of the nickel metal hydride battery 12 to this perturbing signal is $S(t)=X_0 K(\omega)\sin(\omega[t+\phi(\omega)])$ and is correlated with two reference signals, one in phase with x(t) and the other 90° out of phase with x(t), e.g. sin(ωt) and cos(ωt), in order to calculate:

$$\mathcal{R} = \frac{1}{T}\int_0^T S(t)\sin\omega t\, dt \qquad \text{EQUATION 4}$$

$$\mathcal{I} = \frac{1}{T}\int_0^T S(t)\cos\omega t\, dt \qquad \text{EQUATION 5}$$

This allows the elimination of higher order harmonics than the fundamental and with an appropriate selection of frequency window and multiple measurements, noise rejection can be very high. In the limit as $$T\to\infty, \mathcal{R}\to K(\omega)\cos\phi(\omega), \mathcal{I}\to K(\omega)\sin\phi(\omega),$$

where K(ω) represents the amplitude of the impedance at a frequency ω/2π and φ(ω) represents the phase of the impedance at frequency ω/2π. Circuit 30 allows the determination of the impedance at different frequencies and may be set up to measure the impedance at the single frequency of interest. Instruments that can be used to perform the impedance measurements are commercially available. For example, the Solartron 1260 Impedance/Gain-Phase Analyzer available from Solartron, Inc., Houston, Tex., is suitable for this purpose.

Figure 6:
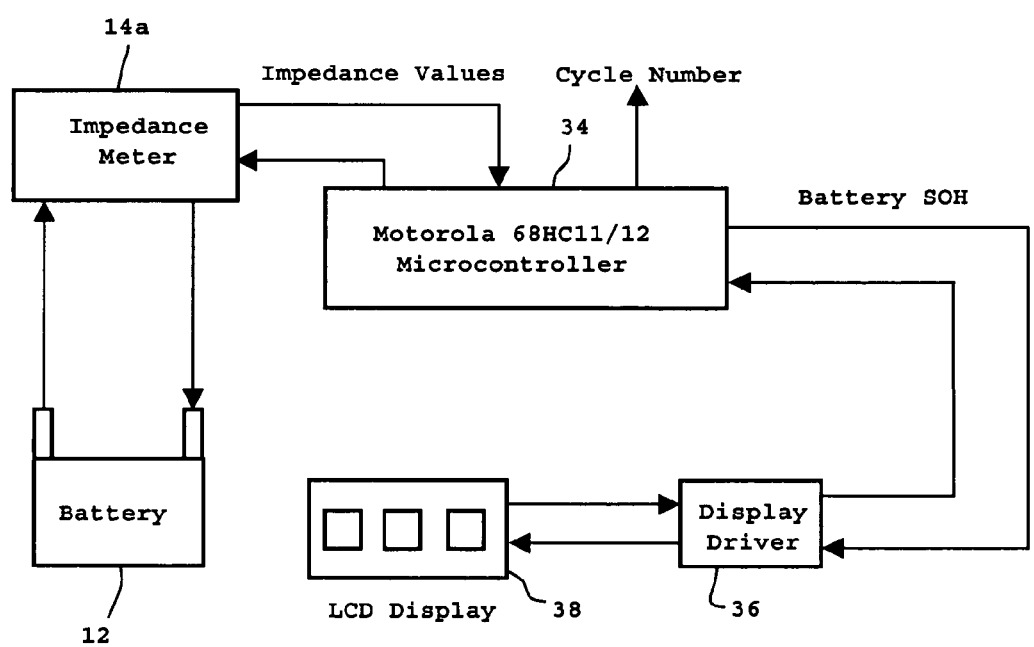
FIG. 6 is a circuit block diagram for determining state-of-health of a nickel metal hydride battery in accordance with the present invention.

A circuit such as that shown in FIG. 6 may be used to determine nickel metal hydride battery SOH once the impedances are known. The impedance values at the three frequencies from circuit 30 are fed into a microcontroller 34 (e.g. Motorola MC 68HC11/12) either as analog or digital signals, wherein analog signals would be fed into the A/D converters on microcontroller 34 where they would be converted to digital signals. The magnitude of the impedance at 10 Hz, $|Z_1|$, is stored in a first memory location, the phase angle of the impedance at 10 Hz, $\theta_1$, is stored in a second memory location, the magnitude of the impedance at 251 Hz, $|Z_2|$, is stored in a third memory location, and the phase angle of the impedance at 251 Hz, $\theta_2$, is stored in a fourth memory location, the magnitude of the impedance at 3981 Hz, $|Z_3|$, is stored in a fifth memory location, and the phase angle at 3981 Hz is stored at a sixth memory location, and the cycle number is stored at a seventh memory location. The variables Z and θ are used to compute the real and imaginary parts of the impedance at 10 Hz and at 251 Hz and the real part of the impedance at 3981 Hz using the equations $Z'=|Z|\cos\theta$ and $Z''=|Z|\sin\theta$. These computations are performed within the microcontroller and the resulting real component of the impedance at 10 Hz, $Z_1'$, and the imaginary component of the impedance at 10 Hz, $Z_1''$, and the real component of the impedance at 251 Hz, $Z_2'$, the imaginary component of the impedance at 251 Hz, $Z_2''$, and the real component of the impedance at 3981 Hz are stored in an eighth, ninth, tenth, eleventh, and twelfth memory locations respectively. The variables in the $7^{th}$ through $12^{th}$ memory locations serve as the input variables to the fuzzy system to determine the SOH of the nickel metal hydride battery 12. The output of this fuzzy system, the SOH of nickel metal hydride battery 12, is stored in a thirteenth memory location. The battery SOH is then output to a display driver 36 and interfaced to a liquid crystal display 38.

In one embodiment of this method, a fuzzy system implementation for determining the SOH of a series string of three Sanyo 2.7 Ah nickel metal hydride cells. The nickel metal hydride batteries are charged at a 0.9 A constant current for a period of 4 hours followed by a discharge at a constant current of 1.33A to a 3.0V cutoff voltage. This embodiment estimates the available capacity available from said nickel metal hydride battery at various cycles between the $109^{th}$ cycle and the $138^{th}$ cycle. A complete cycle is considered to be the complete charging of the battery followed by a complete discharge of the battery, the charging parameters and discharging parameters being as described in the previous sentence.

Figure 7A:
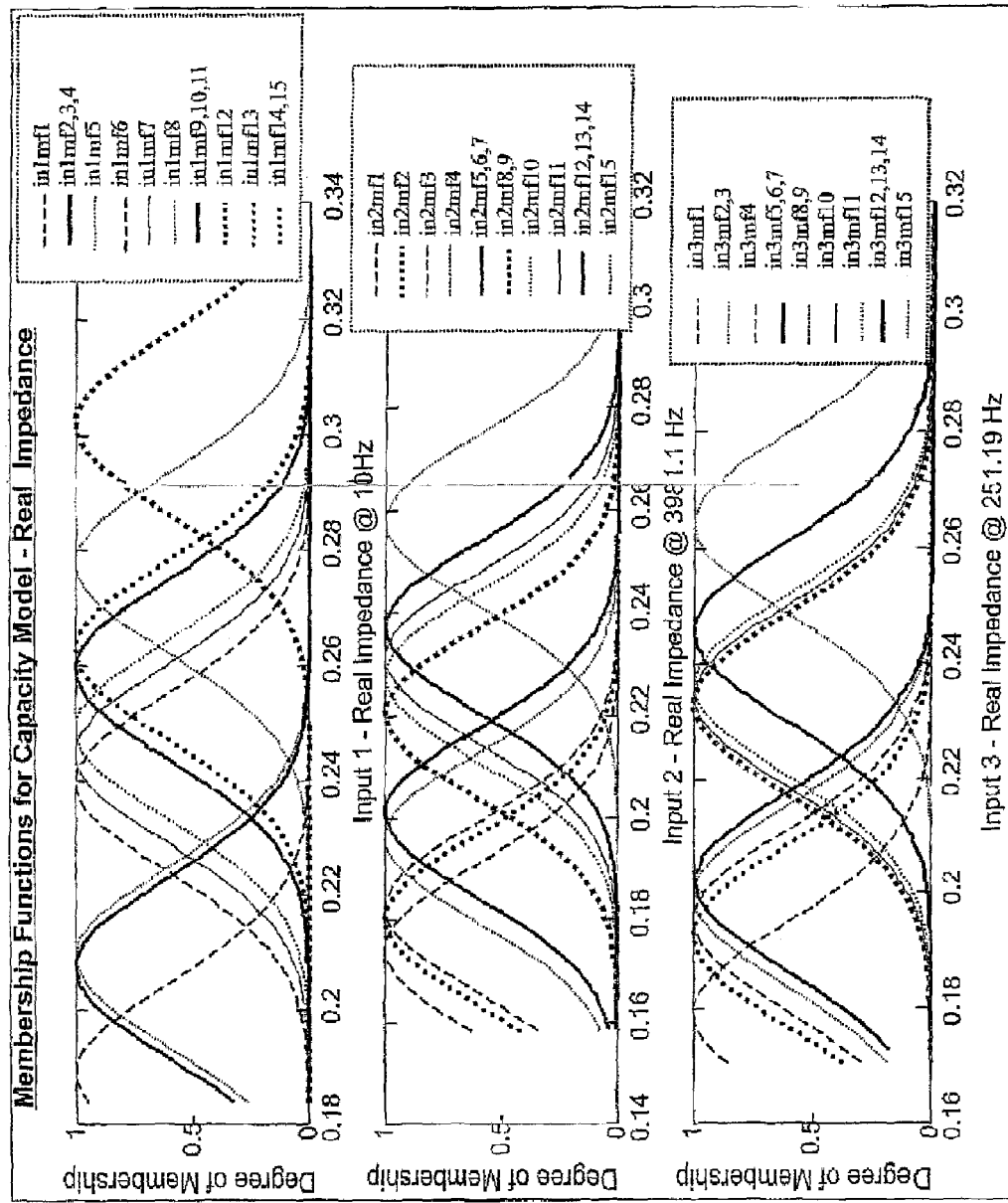
FIGS. 7A, and 7B are membership functions for the five input variables used in the fuzzy system to determine state of health of nickel metal hydride battery in accordance with present invention.
Figure 7B:
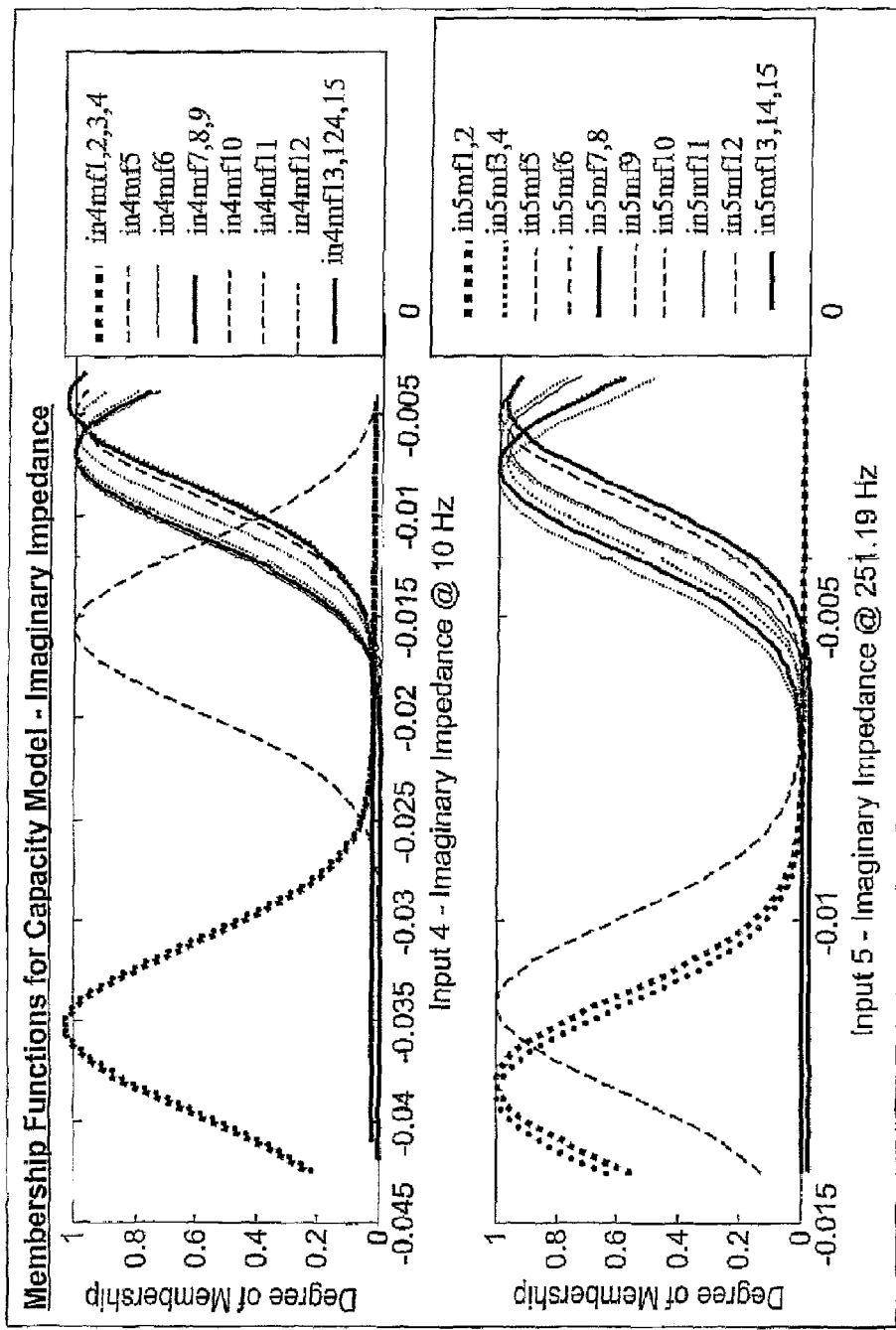

A 5-input 1-output fuzzy logic model is used to estimate the available full-charge capacity of the nickel metal hydride battery. This is then combined with the cycle number datum to estimate the SOH of the nickel metal hydride battery. The five input variables to the fuzzy logic model are: 1) the real part of the impedance at 10 Hz, 2) the real part of the impedance at 3981 Hz, 3) the real part of the impedance at 251 Hz, 4) the imaginary part of the impedance at 10 Hz, and 5) the imaginary part of the impedance at 251 Hz. The output of the fuzzy logic model is the available full charge capacity of the battery. The input membership functions for the model are shown in FIG. 7 and the rule set is given in Table 1.

TABLE 1

Fuzzy Logic Model Rules for Nickel Metal Hydride Battery Capacity Estimation.

If (in1 is in1mf1) and (in2 is in2mf1) and (in3 and in3mf1) and (in4 is in4mf1)
and (in5 is in5mf1) then (out1 is out1mf1) (1)
If (in1 is in1mf2) and (in2 is in2mf2) and (in3 and in3mf2) and (in4 is in4mf2)
and (in5 is in5mf2) then (out1 is out1mf2)
If (in1 is in1mf3) and (in2 is in2mf3) and (in3 and in3mf3) and (in4 is in4mf3)
and (in5 is in5mf3) then (out1 is out1mf3)
If (in1 is in1mf4) and (in2 is in2mf4) and (in3 and in3mf4) and (in4 is in4mf4)
and (in5 is in5mf4) then (out1 is out1mf4)
If (in1 is in1mf5) and (in2 is in2mf5) and (in3 and in3mf5) and (in4 is in4mf5)
and (in5 is in5mf5) then (out1 is out1mf5)
If (in1 is in1mf6) and (in2 is in2mf6) and (in3 and in3mf6) and (in4 is in4mf6)
and (in5 is in5mf6) then (out1 is out1mf6)
If (in1 is in1mf7) and (in2 is in2mf7) and (in3 and in3mf7) and (in4 is in4mf7)
and (in5 is in5mf7) then (out1 is out1mf7)
If (in1 is in1mf8) and (in2 is in2mf8) and (in3 and in3mf8) and (in4 is in4mf8)
and (in5 is in5mf8) then (out1 is out1mf8)
If (in1 is in1mf9) and (in2 is in2mf9) and (in3 and in3mf9) and (in4 is in4mf9)
and (in5 is in5mf9) then (out1 is out1mf9)
If (in1 is in1mf10) and (in2 is in2mf10) and (in3 and in3mf10) and (in4 is in4mf10)
and (in5 is in5mf10) then (out1 is out1mf10)
If (in1 is in1mf11) and (in2 is in2mf11) and (in3 and in3mf11) and (in4 is in4mf11)
and (in5 is in5mf11) then (out1 is out1mf11)
If (in1 is in1mf12) and (in2 is in2mf12) and (in3 and in3mf12) and (in4 is in4mf12)
and (in5 is in5mf12) then (out1 is out1mf12)
If (in1 is in1mf13) and (in2 is in2mf13) and (in3 and in3mf13) and (in4 is in4mf13)
and (in5 is in5mf13) then (out1 is out1mf13)
If (in1 is in1mf14) and (in2 is in2mf14) and (in3 and in3mf14) and (in4 is in4mf14)
and (in5 is in5mf14) then (out1 is out1mf14)
If (in1 is in1mf15) and (in2 is in2mf15) and (in3 and in3mf15) and (in4 is in4mf15)
and (in5 is in5mf15) then (out1 is out1mf15)

where in1 is the real component of the impedance @ 10 Hz
in2 is the real component of the impedance @ 3981.1 Hz
in3 is the real component of the impedance @ 251.1 Hz
in4 is the imaginary component of the impedance @ 10 Hz
in5 is the imaginary component of the impedance @ 251.1 Hz and
out1 is the Available Full-Charge Capacity (Ah)

While preferred embodiments have been shown and described, various modifications and substitutions may be made thereto without departing from the spirit and scope of the invention. Terms such as "first" and "second" as used herein are not intended to imply an order of importance or location, but merely to distinguish between one element and another of like kind. It is to be understood that the invention has been described by way of illustration only, and such illustrations and embodiments as have been disclosed herein are not to be construed as limiting to the claims.

What is claimed is:

1. A method of determining the state-of-health of a nickel-metal hydride battery connected to a load, the method comprising:
   detecting an impedance characteristic of the battery at at least one selected frequency; and
   determining the state-of-health of the battery from a fuzzy system trained in a relationship between said impedance characteristic at said at least one frequency and said state-of-health, wherein said state-of-health is a function of and varies with the battery's ability to deliver power required by the load and the battery's capacity to meet load requirements.

2. The method of claim 1 wherein said detecting comprises:
   detecting a real part of said impedance at a first set of selected frequencies, said first set of selected frequencies including at least one frequency; and
   detecting an imaginary part of an impedance of the battery at each of a second set of selected frequencies, said second set of selected frequencies including at least one frequency.

3. The method of claim 2 wherein said second set of selected frequencies comprises a subset of said first set of selected frequencies.

4. The method of claim 2 wherein said first set of selected frequencies includes three frequencies spanning a range of at least 2 decades.

5. The method of claim 2 wherein said first set of selected frequencies comprises a first frequency f1, a second frequency f2, and a third frequency f3, wherein f1, f2, and f3 satisfy the following relations:
   about 10 Hz$\leq$f1$\leq$about 30 Hz;
   about 100 Hz$\leq$f2$\leq$about 500 Hz; and
   about 400 Hz$\leq$f3$\leq$about 10 kHz.

6. The method of claim 5 wherein said second set of selected frequencies comprises a subset of the first set of selected frequencies.

7. The method of claim 5 wherein f1, f2, and f3 satisfy the following relations:
   about 10 Hz$\leq$f1$\leq$about 20 Hz;
   about 200 Hz$\leq$f2$\leq$about 500 Hz; and
   about 2 kHz$\leq$f3$\leq$about 10 kHz.

8. The method of claim 7 wherein said second set of selected frequencies comprise f1 and f2.

9. The method of claim 7 wherein f1 is about 10 Hz, f2 is about 251 Hz, and f3 is about 3981 Hz and said second set of selected frequencies comprises f1 and f2.

10. A system for detecting a state of health of a nickel metal hydride battery, the system comprising:

a microcontroller adapted to receive inputs from an impedance measurement device and a voltage measurement device, the microcontroller including software causing the microcontroller to perform operations including:

storing an input value corresponding to an impedance characteristic at at least one selected frequency;

inputting each said input value into a fuzzy system trained in a relationship between each said value and said state-of-health, said state-of-health being a function of the battery's ability to deliver power required by the load and the battery's capacity to meet load requirements; and storing an output value from the fuzzy system, said output value corresponds to said state-of-health of the battery.

11. The system of claim 10 wherein said storing an input value comprises:

storing a real part of said impedance at said each of a first set of selected frequencies; and storing an imaginary part of an impedance of the battery at each of a second set of selected frequencies, said second set of selected frequencies including at least one frequency.

12. The system of claim 11 wherein said second set of selected frequencies comprises a subset of said first set of selected frequencies.

13. The system of claim 11 wherein said first set of selected frequencies includes three frequencies spanning a range of at least 2 decades.

14. The system of claim 11 wherein said first set of selected frequencies comprises a first frequency f1, a second frequency f2, and a third frequency f3, wherein f1, f2, and f3 satisfy the following relations:

about 10 Hz $\leq$ f1 $\leq$ about 30 Hz;

about 100 Hz $\leq$ f2 $\leq$ about 500 Hz; and about 400 Hz $\leq$ f3 $\leq$ about 10 kHz.

15. The system of claim 14 wherein said second set of selected frequencies comprises a subset of the first set of selected frequencies.

16. The system of claim 14 wherein f1, f2, and f3 satisfy the following relations:

about 10 Hz $\leq$ f1 $\leq$ about 20 Hz;

about 200 Hz $\leq$ f2 $\leq$ about 500 Hz; and about 2 kHz $\leq$ f3 $\leq$ about 10 kHz.

17. The system of claim 16 wherein said second set of selected frequencies comprise f1 and f2.

18. The system of claim 17 wherein f1 is about 10 Hz, f2 is about 251 Hz, and f3 is about 3981 Hz and said second set of selected frequencies comprises f1 and f2.

19. The system of claim 16 wherein said fuzzy system is implemented by said microcontroller.

20. The system of claim 10 wherein said fuzzy system is implemented by said microcontroller.

* * * * *